United States Patent
Yen

(10) Patent No.: US 8,492,746 B2
(45) Date of Patent: Jul. 23, 2013

(54) LIGHT EMITTING DIODE (LED) DICE HAVING WAVELENGTH CONVERSION LAYERS

(75) Inventor: Jui-Kang Yen, Taipei (TW)

(73) Assignee: SemiLEDS Optoelectronics Co., Ltd., Chu-Nan (TW)

( * ) Notice: Subject to any disclaimer, the term of this patent is extended or adjusted under 35 U.S.C. 154(b) by 0 days.

(21) Appl. No.: 13/463,874

(22) Filed: May 4, 2012

(65) Prior Publication Data

US 2013/0062592 A1    Mar. 14, 2013

Related U.S. Application Data

(63) Continuation-in-part of application No. 13/229,824, filed on Sep. 12, 2011.

(51) Int. Cl.
| | |
|---|---|
| *H01L 29/06* | (2006.01) |
| *H01L 31/0328* | (2006.01) |
| *H01L 31/0336* | (2006.01) |
| *H01L 31/072* | (2012.01) |
| *H01L 31/109* | (2006.01) |

(52) U.S. Cl.
USPC  257/14; 257/15; 257/E31.033; 257/E31.034; 257/E31.035; 257/E31.036; 257/E33.008; 257/E33.009; 257/E33.01

(58) Field of Classification Search
USPC ....... 257/14, 15, E31.033, E31.034, E31.035, 257/E31.036, E33.008, E33.009, E33.01
See application file for complete search history.

(56) References Cited

U.S. PATENT DOCUMENTS

| | | | | |
|---|---|---|---|---|
| 5,936,258 | A | * | 8/1999 | Imamura et al. ................. 257/21 |
| 5,998,925 | A | | 12/1999 | Shimizu et al. |
| 6,351,069 | B1 | | 2/2002 | Lowery et al. |
| 6,504,181 | B2 | | 1/2003 | Furukawa et al. |
| 6,576,488 | B2 | | 6/2003 | Collins, III et al. |
| 6,596,555 | B2 | * | 7/2003 | Bensahel et al. ................. 438/22 |
| 6,642,652 | B2 | | 11/2003 | Collins, III et al. |
| 6,744,196 | B1 | | 6/2004 | Jeon |
| 6,774,560 | B1 | * | 8/2004 | Smith et al. .................... 313/503 |
| 6,982,522 | B2 | * | 1/2006 | Omoto .......................... 313/502 |
| 7,045,956 | B2 | | 5/2006 | Braune et al. |
| 7,132,692 | B2 | * | 11/2006 | Izumi et al. ..................... 257/79 |
| 7,195,944 | B2 | | 3/2007 | Tran et al. |

(Continued)

FOREIGN PATENT DOCUMENTS

| | | | |
|---|---|---|---|
| JP | 2007157798 A | * | 6/2007 |
| WO | WO 2004040661 | | 5/2004 |

OTHER PUBLICATIONS

Edward D. Cohen, "Choosing the Coating Method", Modern Coating and Drying Technology, date unavailable, pp. 1-20.

(Continued)

*Primary Examiner* — Ida M Soward
(74) *Attorney, Agent, or Firm* — Stephen A. Gratton

(57) ABSTRACT

A light emitting diode (LED) die includes a wavelength conversion layer having a base material, and a plurality of particles embedded in the base material including wavelength conversion particles, and reflective particles. A method for fabricating light emitting diode (LED) dice includes the steps of mixing the wavelength conversion particles in the base material to a first weight percentage, mixing the reflective particles in the base material to a second weight percentage, curing the base material to form a wavelength conversion layer having a selected thickness, and attaching the wavelength conversion layer to a die.

19 Claims, 2 Drawing Sheets

U.S. PATENT DOCUMENTS

| | | | |
|---|---|---|---|
| 7,265,374 B2 * | 9/2007 | Lee et al. | 257/13 |
| 7,358,101 B2 * | 4/2008 | Yang et al. | 438/21 |
| 7,361,938 B2 | 4/2008 | Mueller et al. | |
| 7,432,119 B2 | 10/2008 | Doan | |
| 7,539,223 B2 * | 5/2009 | Tokunaga | 372/23 |
| 7,544,309 B2 * | 6/2009 | Juestel et al. | 252/301.4 F |
| 7,569,406 B2 * | 8/2009 | Keller et al. | 438/27 |
| 7,582,906 B2 * | 9/2009 | Kurihara | 257/79 |
| 7,615,789 B2 | 11/2009 | Tran | |
| 7,635,873 B2 * | 12/2009 | Harada | 257/95 |
| 7,646,033 B2 | 1/2010 | Tran et al. | |
| 7,737,459 B2 | 6/2010 | Edmond et al. | |
| 7,781,783 B2 | 8/2010 | Yen et al. | |
| 7,786,550 B2 * | 8/2010 | Takizawa | 257/611 |
| 7,824,941 B2 | 11/2010 | Braune et al. | |
| 7,863,635 B2 * | 1/2011 | Andrews et al. | 257/98 |
| 7,901,592 B2 * | 3/2011 | Schmidt et al. | 252/301.4 F |
| 8,012,774 B2 | 9/2011 | Tran et al. | |
| 8,084,934 B2 * | 12/2011 | Kim et al. | 313/501 |
| 8,143,079 B2 * | 3/2012 | Scianna et al. | 438/27 |
| 8,269,239 B2 * | 9/2012 | Shylo et al. | 257/98 |
| 8,314,547 B2 * | 11/2012 | Klein et al. | 313/504 |
| 8,410,679 B2 * | 4/2013 | Ibbetson et al. | 313/501 |
| 2002/0076904 A1 | 6/2002 | Imler | |
| 2002/0089058 A1 | 7/2002 | Hedler et al. | |
| 2002/0185965 A1 | 12/2002 | Collins et al. | |
| 2004/0077114 A1 | 4/2004 | Coman et al. | |
| 2004/0245543 A1 | 12/2004 | Yoo | |
| 2005/0173692 A1 | 8/2005 | Park et al. | |
| 2006/0003477 A1 | 1/2006 | Braune et al. | |
| 2006/0061259 A1 | 3/2006 | Negley | |
| 2007/0267646 A1 | 11/2007 | Wierer, Jr. et al. | |
| 2009/0218581 A1 * | 9/2009 | Schmidt et al. | 257/98 |
| 2009/0272996 A1 * | 11/2009 | Chakraborty | 257/98 |
| 2009/0273918 A1 | 11/2009 | Falicoff et al. | |
| 2010/0165599 A1 | 7/2010 | Allen | |
| 2010/0308356 A1 * | 12/2010 | Wirth | 257/98 |
| 2011/0089456 A1 * | 4/2011 | Andrews et al. | 257/98 |
| 2011/0108797 A1 * | 5/2011 | Yang et al. | 257/13 |
| 2011/0146775 A1 * | 6/2011 | Kim et al. | 136/255 |
| 2011/0168242 A1 * | 7/2011 | Duerr et al. | 136/252 |
| 2012/0068209 A1 * | 3/2012 | Andrews | 257/98 |
| 2013/0039617 A1 * | 2/2013 | Illek et al. | 385/14 |
| 2013/0042527 A1 * | 2/2013 | Aikala et al. | 47/58.1 LS |

OTHER PUBLICATIONS

U.S. Appl. No. 13/229,824, filed Sep. 12, 2011, Inventors: Trung Tri Doan et al., "Method for Fabricating Light Emitting Diode (LED) Devices Having Output With Selected Characteristics", pp. 1-24.

* cited by examiner

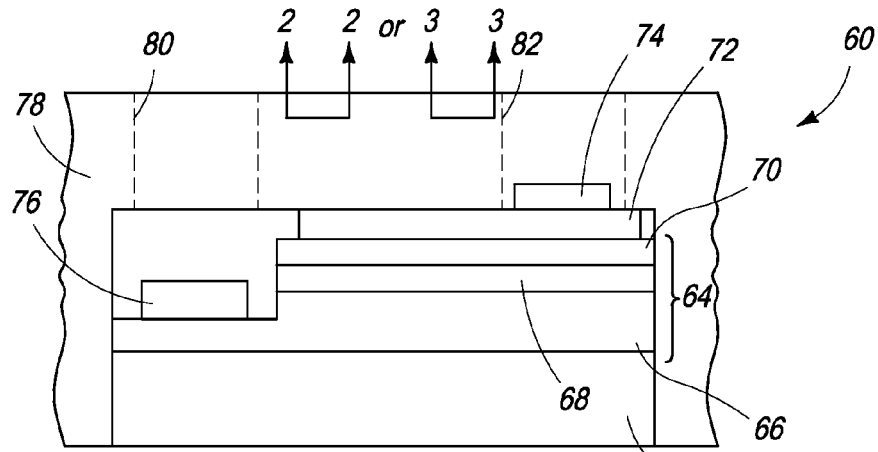

FIG. 4

```
Forming (or providing) a plurality of LED dice having a selected
configuration on a wafer.
            │
            ▼
Providing a base material in viscous form.
            │
            ▼
Providing a plurality of wavelength conversion particles having a first
diameter, and a plurality of relective particles having a second diameter.
            │
            ▼
Mixing the wavelength conversion particles in the base material to a first
weight percentage, mixing the relective particles in the base material to
a second weight percentage, and curing the base material to the
selected thickness to form a plurality of wavelength conversion layers
having a selected thickness T.
            │
            ▼
Attaching the wavelength conversion layers to the dice.
            │
            ▼
Forming openings in the wavelength conversion layers aligned with one
or more electrodes on the dice.
            │
            ▼
Singulating the wafer.
```

FIG. 5

LIGHT EMITTING DIODE (LED) DICE HAVING WAVELENGTH CONVERSION LAYERS

CROSS REFERENCE TO RELATED APPLICATIONS

This application is a continuation-in-part of Ser. No. 13/229,824 filed Sep. 12, 2011, which is incorporated herein by reference.

BACKGROUND

This disclosure relates generally to light emitting diodes (LED) dice and more particularly to light emitting diode (LED) dice having wavelength conversion layer and to methods for fabricating light emitting diode (LED) dice with the wavelength conversion layers.

Light emitting diode (LED) dice have been developed that produce white light. In order to produce white light, a blue (LED) die can be used in combination with a wavelength conversion layer, such as a phosphor layer formed on the surface of the die. The electromagnetic radiation emitted by the blue (LED) die excites the atoms of the wavelength conversion layer, which converts some of the electromagnetic radiation in the blue wavelength spectral region to the yellow wavelength spectral region. The ratio of the blue to the yellow can be manipulated by the composition and geometry of the wavelength conversion layer, such that the output of the light emitting diode (LED) die appears to be white light.

In this type of light emitting diode (LED) die, the characteristics of the white light are determined by the electromagnetic radiation emitted by the blue LED die and by the wavelength conversion properties of the wavelength conversion layer. For example, the color composite of the white light depends upon the spectral distributions of electromagnetic radiation produced by the blue LED die and the wavelength conversion layer. Any variations in these spectral distributions can vary the color composite of the white light produced by the light emitting diode (LED) device. Because of the variations in the configurations of the blue LED die and the wavelength conversion layer, the white light can have an undesirable color balance and lack the characteristics of a true color rendition.

It is difficult to fabricate white light emitting diode (LED) dice with consistent color balance because any variations in the fabrication process can change the outputs of the light emitting diode (LED) dice and the wavelength conversion layers. The present disclosure is directed to a method for fabricating light emitting diode (LED) dice with wavelength conversion layers.

SUMMARY

A light emitting diode (LED) die includes a wavelength conversion layer comprising a base material with a selected thickness, and a plurality of particles with a selected size and concentration embedded in the base material. The particles can include wavelength conversion particles having a first diameter and weight percentage in the base material, and reflective particles having a second diameter and weight percentage in the base material. The wavelength conversion particles can also include different types of particles comprised of different materials having selected diameters and concentrations in the base material. The light emitting diode (LED) die can be constructed as a vertical light emitting diode (VLED) or as a planar light emitting diode (PLED) die.

A method for fabricating light emitting diode (LED) dice includes the steps of providing a light emitting diode (LED) die having a desired configuration, providing a base material in viscous form, providing a plurality of wavelength conversion particles having a first diameter, and providing a plurality of reflective particles having a second diameter. The method also includes the steps of mixing the wavelength conversion particles in the base material to a first weight percentage, mixing the reflective particles in the base material to a second weight percentage, and curing the base material to the selected thickness to form a wavelength conversion layer. The method also includes the step of attaching the wavelength conversion layer to the die, and forming openings in the wavelength conversions layer aligned with one or more electrodes on the die.

BRIEF DESCRIPTION OF THE DRAWINGS

FIG. 4 is a schematic cross sectional view of a second light emitting diode (LED) die having a wavelength conversion layer; and FIG. 5 is a flow diagram illustrating steps in a method for fabricating the light emitting diode (LED) die of FIG. 1 or FIG. 2.

DETAILED DESCRIPTION

It is to be understood that when an element is stated as being "on" another element, it can be directly on the other element or intervening elements can also be present. However, the term "directly" means there are no intervening elements. In addition, although the terms "first", "second" and "third" are used to describe various elements, these elements should not be limited by the term. Also, unless otherwise defined, all terms are intended to have the same meaning as commonly understood by one of ordinary skill in the art.

Figure 1:
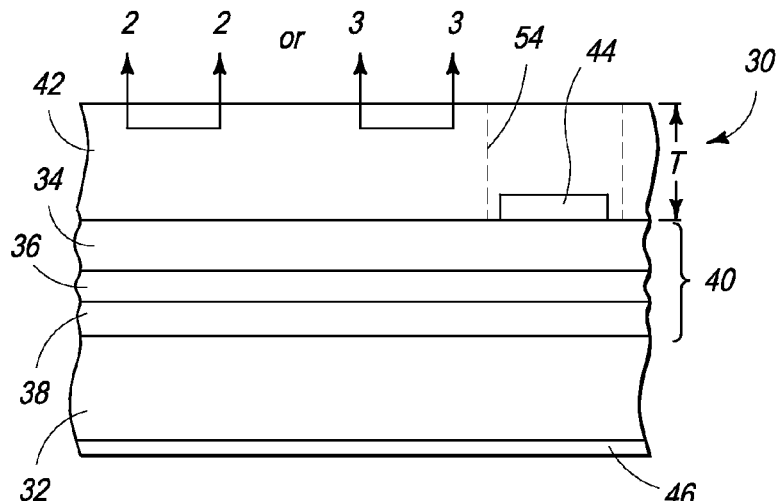
FIG. 1 is a schematic cross sectional view of a light emitting diode (LED) die having a wavelength conversion layer.

Referring to FIG. 1, a light emitting diode (LED) die 30 is illustrated. The light emitting diode (LED) die 30 is in the form of a vertical light emitting diode (VLED). For simplicity various elements of the light emitting diode (LED) die 30 are not illustrated. However, this type of vertical light emitting diode (VLED) die is further described in U.S. Pat. No. 7,615,789, which is incorporated herein by reference. Although the light emitting diode (LED) die 30 is described as a vertical light emitting diode (VLED), it is to be understood that the concepts described herein can also be applied to other types of light emitting diode (LED) dice such as ones with planar electrode configurations.

The light emitting diode (LED) die 30 includes a conductive substrate 32, and an epitaxial stack 40 on the conductive substrate 32. The epitaxial stack 40 includes an n-type confinement layer 34, a multiple quantum well (MQW) layer 36 in electrical contact with the n-type confinement layer 34 configured to emit electromagnetic radiation, and a p-type confinement layer 38 in electrical contact with the multiple quantum well (MQW) layer 36.

The n-type confinement layer 34 preferably comprises n-GaN. Other suitable materials for the n-type confinement layer 34 include n-AlGaN, n-InGaN, n-AlInGaN, AlInN and n-AlN. The multiple quantum well (MQW) layer 36 preferably includes one or more quantum wells comprising one or more layers of InGaN/GaN, AlGaInN, AlGaN, AlInN and AlN. The multiple quantum well (MQW) layer 36 can be configured to emit electromagnetic radiation from the visible spectral region (e.g., 400-770 nm), the violet-indigo spectral region (e.g., 400-450 nm), the blue spectral region (e.g., 450-490 nm), the green spectral region (e.g., 490-560 nm), the yellow spectral region (e.g., 560-590 nm), the orange spectral region (e.g., 590-635 nm) or the red spectral region (e.g., 635-700 nm). The p-type confinement layer 38 preferably comprises p-GaN. Other suitable materials for the p-type confinement layer 38 include p-AlGaN, p-InGaN, p-AlInGaN, p-AlInN and p-AlN.

Still referring to FIG. 1, the light emitting diode (LED) die 30 also includes an n-electrode 44 on the n-type confinement layer 34 and a p-electrode 46 on the backside of the conductive substrate 32. The n-electrode 44 and the p-electrode 46 can comprise a conductive material, such as a single layer of a metal such as W, Ti, Mo, Al, Cu, Ni, Ag, Au or Co, a metal alloy such as Cu—Co or Cu—Mo, or a metal stack such as Ni/Cu or Ni/Cu—Mo.

The light emitting diode (LED) die 30 also includes a wavelength conversion layer 42 formed on the epitaxial stack 40 in contact with the n-type confinement layer 34. The wavelength conversion layer 42 has a thickness of T on the n-type confinement layer 34 and includes an opening 54 aligned with the n-electrode 44 for providing access to the n-electrode 44. The thickness T of the wavelength conversion layer 42 is preferably less than 100 μm and more preferably less than about 50 μm.

The wavelength conversion layer 42 is configured to convert at least some of the electromagnetic radiation emitted by the multiple quantum well (MQW) layer 36 into electromagnetic radiation having a different wavelength range, such as a higher wavelength range. For example, if the multiple quantum well (MQW) layer 36 emits electromagnetic radiation in a blue spectral range, the wavelength conversion layer 42 can be configured to convert at least some of this radiation to a yellow spectral range, such that the output of the light emitting diode (LED) die 30 appears to be white light. With the wavelength conversion layer 42 having a thickness of T of less than 100 μm, a yellow ring common with the production of radiation in the yellow spectral range is reduced or eliminated.

Figure 2:
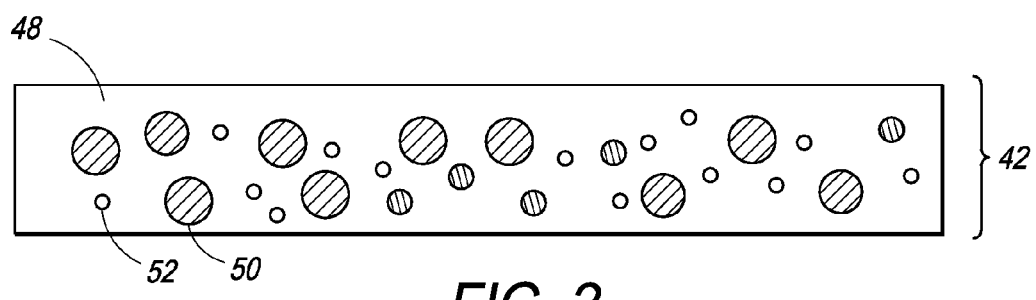
FIG. 2 is an enlarged schematic cross sectional view of a wavelength conversion layer taken along section line 2-2 of FIG. 1.

As shown in FIG. 2, the wavelength conversion layer 42 can comprise a base material 48, a plurality of wavelength conversion particles 50 embedded in the base material 48, and a plurality of reflective particles 52 embedded in the base material 48.

The base material 48 can comprise a curable polymer such as silicone or epoxy. The wavelength conversion particles 50 can comprise a material configured to convert the electromagnetic radiation produced by the multiple quantum well (MQW) layer 36 substantially as previously described. Suitable materials for the wavelength conversion particles 50 include phosphor compounds such as YAG:Ce, TAG:Ce, alkaline earth silicon nitride doped with Eu, alkaline earth silicate doped with Eu, or calcium scandate doped with Ce. In addition, the wavelength conversion particles 50 have a selected diameter and concentration in the base material 48. For example, the wavelength conversion particles 50 can have a diameter of from about 8 μm to 40 μm where a median particle size is designated as D50. A weight percentage (wt. %) of the wavelength conversion particles in the base material 48 can be from 10 wt % to 85 wt %.

The reflective particles 52 can comprise a material configured to reflect the electromagnetic radiation produced by the multiple quantum well (MQW) layer 36. Suitable materials for the reflective particles 52 include $TiO_2$, $Al_2O_3$, $SiO_2$ or other white powder. In addition, the reflective particles 52 have a selected diameter and concentration in the base material 48. For example, the reflective particles 52 can have a diameter of from about 10 nm to 500 nm where a median particle size is designated as D50. A weight percentage (wt. %) of the reflective particles 52 in the base material 48 can be from 0.1 wt % to 10 wt %.

As shown in Table 1, the particle size for the wavelength conversion particles 50 affects both the relative brightness (%) and the color uniformity of the electromagnetic radiation produced by the light emitting diode (LED) die 30. In general, smaller particle sizes, where a median particle size is designated as D50, produce less relative brightness but with more color uniformity. Conversely, larger particle sizes produce more relative brightness but with less color uniformity.

TABLE 1

| Particle size (D50, μm) | Relative Brightness (%) | Color Uniformity |
|---|---|---|
| 15 | 111 | Acceptable |
| 11 | 107 | Good |
| 8 | 104 | Better |
| 5 | 100 | Best |

Figure 3:
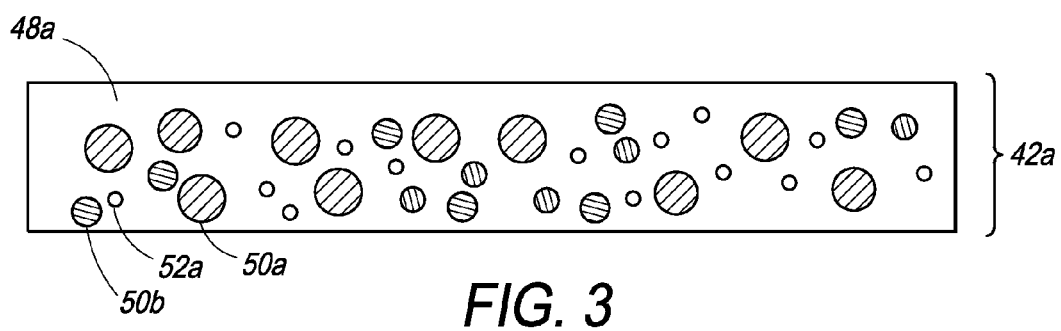
FIG. 3 is an enlarged schematic cross sectional view of an alternate wavelength conversion layer taken along section line 3-3 of FIG. 1.

As shown in FIG. 3, an alternate wavelength conversion layer 42A can comprise a base material 48A, a plurality of first wavelength conversion particles 50A embedded in the base material 48A, a plurality of second wavelength conversion particles 50B embedded in the base material 48A, and a plurality of reflective particles 52A embedded in the base material 48A. All of these elements can be equivalent to the previously described elements. However, the first wavelength conversion particles 50A can comprise a first phosphor compound such as YAG:Ce, TAG:Ce, alkaline earth silicate doped with Eu, or calcium scandate doped with Ce, and the second wavelength conversion particles 50B can comprise a second phosphor compound such as alkaline earth silicon nitride doped with Eu. The first wavelength conversion particles 50A and the second wavelength conversion particles 50B can also have different sizes and concentrations in the base material.

Referring to FIG. 4, a planar light emitting diode (LED) die 60 is illustrated. The light emitting diode (LED) die 60 includes a transparent substrate 62, and an epitaxial stack 64 on the transparent substrate 62. The epitaxial stack 64 includes an n-type confinement layer 66, a multiple quantum well (MQW) layer 68 in electrical contact with the n-type confinement layer 66 configured to emit electromagnetic radiation, and a p-type confinement layer 70 in electrical contact with the multiple quantum well (MQW) layer 68. The planar light emitting diode (LED) die 60 also includes a transparent conductive layer 72 and a p-electrode 74 on the p-type confinement layer 70. The planar light emitting diode (LED) die 60 also includes an n-electrode 76 on the n-type confinement layer 66. The planar light emitting diode (LED) die 60 also includes a wavelength conversion layer 78 having a first opening 80 aligned with the n-electrode 76 and a second opening 82 aligned with the p-electrode 74. The wavelength conversion layer 78 can be configured substantially as previously described for wavelength conversion layer 42 (FIG. 2) with wavelength conversion particles 50 and reflective particles 52, or as previously described from wavelength conversion layer 42A (FIG. 3) with multiple wavelength conversion particles 50A, 50B and reflective particles 52A.

Referring to FIG. 5, steps in a method for fabricating light emitting diode (LED) dice 30 are illustrated. The method includes the step of forming (or providing) a plurality of LED dice having a selected configuration on a wafer. For example, each LED die can comprise a vertical light emitting diode (VLED) die or a planar light emitting diode (PLED) die, substantially as previously described. In addition the method can be performed at the wafer level using a plurality of separate dice contained on a wafer. For example, vertical light emitting diode (VLED) dice can be fabricated at the wafer level using processes known in the art, such as disclosed in U.S. Pat. No. 7,195,944 B2 to Tran et al., and U.S. Pat. No. 7,615,789 B2 to Tran, both of which are incorporated herein by reference. The LED dice can also be provided by a manufacturer such as Semileds Corporation of Boise ID and Hsinchu County Taiwan.

The method also includes the step of providing a base material in viscous form. The base material can comprise a curable polymer such as silicone or epoxy having a desired chemical composition.

The method also includes the step of providing a plurality of wavelength conversion particles having a first diameter, and a plurality of reflective particles having a second diameter. For example, the wavelength conversion particles can have a diameter of from about 8 μm to 40 μm, where a median particle size is designated as D50, and the reflective particles can have a diameter of from about 10 nm to 500 nm, where a median particle size is designated as D50.

The method also includes the step of mixing the wavelength conversion particles in the base material to a first weight percentage, mixing the reflective particles in the base material to a second weight percentage, and curing the base material to the selected thickness to form a plurality of wavelength conversion layers having a selected thickness T. A weight percentage (wt. %) of the wavelength conversion particles in the base material can be from 10 wt % to 85 wt %. A weight percentage (wt. %) of the reflective particles in the base material can be from 0.1 wt % to 10 wt %. A thickness T of the wavelength conversion layer can be from 20 μm to 100 μm. For performing these steps, the wavelength conversion particles and the reflective particles can be incorporated into the base material in viscous form using a mixing process to form a viscous mixture, which can then be cured into solid form. The mixture can then be applied to a release film using a coating process such as dip coating, rod coating, blade coating, knife coating, air knife coating, Gravure coating, roll coating or slot and extrusion coating. Further, the wavelength conversion layer can comprise a single layer or multiple layers formed using multiple coating processes. Exemplary coating processes are further described in Chapter 1 (pages 1-20) of Modern Coating And Drying Technology, by Edward D. Cohen, entitled "Choosing The Coating Method", which is incorporated herein by reference. An exemplary release film comprises a fluoropolymer resin manufactured by AGC Chemicals Americas, Inc. under the trademark FLUON. Following a curing process to solidify the mixture, the wavelength conversion layer in solid form can be separated from the release film using a suitable process such as peeling.

The method also includes the step of attaching the wavelength conversion layers to the dice. For performing this step, a sheet containing a plurality of wavelength conversion layers can be cut such that each wavelength conversion layer has a desired size and peripheral shape. Each wavelength conversion layer can then be handled using a suitable device such as a vacuum wand and placed on the light emitting diode (LED) die. In addition, an adhesive such as an adhesive polymer layer can be used to attach the wavelength conversion layer.

The method also includes the step of forming openings in the wavelength conversions layers aligned with one or more electrodes on the dice. This step can be performed using a mask such as a photoresist mask and a suitable etchant to form the openings with a desired size in a desired pattern. This step can also be performed prior to attaching the wavelength conversion layer to the light emitting diode (LED) die.

The method can also include the step of singulating the wafer into the light emitting diode (LED) dice. The singulating step can be performed using a suitable process such as sawing, jetting or etching.

Thus the disclosure describes an improved method for fabricating light emitting diode (LED) devices having wavelength conversion layers. While a number of exemplary aspects and embodiments have been discussed above, those of skill in the art will recognize certain modifications, permutations, additions and subcombinations thereof. It is therefore intended that the following appended claims and claims hereafter introduced are interpreted to include all such modifications, permutations, additions and sub-combinations as are within their true spirit and scope.

What is claimed is:

1. A light emitting diode (LED) die comprising:
a substrate comprising an epitaxial stack having an n-type confinement layer, a multiple quantum well (MQW) layer in electrical contact with the n-type confinement layer configured to emit electromagnetic radiation, and a p-type confinement layer in electrical contact with the multiple quantum well (MQW) layer;
a wavelength conversion layer on the substrate configured to convert at least some of the electromagnetic radiation emitted by the multiple quantum well (MQW) layer into electromagnetic radiation having a different wavelength range,
the wavelength conversion layer comprising a base material with a selected thickness, and a plurality of particles with a selected size and concentration embedded in the base material,
the particles including a plurality of wavelength conversion particles having a first diameter and a first weight percentage in the base material, and a plurality of reflective particles having a second diameter and a second weight percentage in the base material.

2. The light emitting diode (LED) die of claim 1 wherein the wavelength conversion particles include different types of particles comprised of different materials having selected diameters and concentrations in the base material.

3. The light emitting diode (LED) die of claim 1 wherein the light emitting diode (LED) die comprises a vertical light emitting diode (VLED) having the wavelength conversion layer on the n-type confinement layer.

4. The light emitting diode (LED) die of claim 3 wherein the wavelength conversion layer includes an opening aligned with an n-electrode on the n-type confinement layer.

5. The light emitting diode (LED) die of claim 1 wherein the light emitting diode (LED) die comprises a planar light emitting diode (PLED) die having the wavelength conversion layer on the p-type confinement layer.

6. The light emitting diode (LED) die of claim 5 wherein the wavelength conversion layer includes a first opening aligned with an n-electrode on the n-type confinement layer and a second opening aligned with a p-electrode on the p-type confinement layer.

7. The light emitting diode (LED) die of claim 1 wherein the wavelength conversion layer has a thickness less than 100 μm.

8. The light emitting diode (LED) die of claim 1 wherein the wavelength conversion particles comprise a phosphor compound.

9. The light emitting diode (LED) die of claim 1 wherein the reflective particles comprise a material selected from the group consisting of silicone and epoxy.

10. The light emitting diode (LED) die of claim 1 wherein the base material comprises a material selected from the group consisting of $TiO_2$, $Al_2O_3$ and $SiO_2$.

11. The light emitting diode (LED) die of claim 1 wherein the first diameter of the wavelength conversion particles is from 8 μm to 40 μm where a median particle size is designated as D50.

12. The light emitting diode (LED) die of claim 1 wherein the second diameter of the reflective particles is from 10 nm to 500 nm where a median particle size is designated as D50.

13. The light emitting diode (LED) die of claim 1 wherein the first weight percentage of the wavelength conversion particles in the base material is from 10 wt % to 85 wt %.

14. The light emitting diode (LED) die of claim 1 wherein the second weight percentage of the reflective particles in the base material is from 0.1 wt % to 10 wt %.

15. A light emitting diode (LED) die comprising:
a substrate comprising an epitaxial stack having an n-type confinement layer, a multiple quantum well (MQW) layer in electrical contact with the n-type confinement layer configured to emit electromagnetic radiation in a blue spectral range, and a p-type confinement layer in electrical contact with the multiple quantum well (MQW) layer;
a wavelength conversion layer on the substrate having a thickness less than 100 μm configured to convert at least some of the electromagnetic radiation in the blue spectral range into electromagnetic radiation in the yellow spectral range,
the wavelength conversion layer comprising a base material, a plurality of wavelength conversion particles in the base material having a first diameter of from 8 μm to 40 μm and a first weight percentage in the base material of from 10 wt % to 85 wt %, and a plurality of reflective particles having a second diameter of from 10 nm to 500 nm and a second weight percentage in the base material of from 0.1 wt % to 10 wt %.

16. The light emitting diode (LED) die of claim 15 wherein the wavelength conversion particles comprise a phosphor compound.

17. The light emitting diode (LED) die of claim 15 wherein the wavelength conversion particles comprise first wavelength conversion particles comprising a first phosphor compound and second wavelength conversion particles comprising a second phosphor compound.

18. The light emitting diode (LED) die of claim 15 wherein the reflective particles comprise a material selected from the group consisting of silicone and epoxy.

19. The light emitting diode (LED) die of claim 15 wherein the base material comprises a material selected from the group consisting of $TiO_2$, $Al_2O_3$ and $SiO_2$.

* * * * *